(12) United States Patent
Lee et al.

(10) Patent No.: US 8,217,571 B2
(45) Date of Patent: Jul. 10, 2012

(54) ORGANIC LIGHT EMITTING DIODE DISPLAY DEVICE AND METHOD OF MANUFACTURING THE SAME

(75) Inventors: Jae Yoon Lee, Yongsan-gu (KR); Heung Lyul Cho, Suwon-si (KR); Kyung Man Kim, Mapo-gu (KR); Joon Suk Lee, Guro-gu (KR); Do Hyung Kim, Gangnam-gu (KR); Moon Ky Lee, Anyang-si (KR); Woo Jin Nam, Seongnam-si (KR); Jeong Hyun Kim, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 811 days.

(21) Appl. No.: 12/000,327

(22) Filed: Dec. 11, 2007

(65) Prior Publication Data

US 2008/0143255 A1    Jun. 19, 2008

(51) Int. Cl.
*H01J 1/62* (2006.01)
*H01J 63/04* (2006.01)

(52) U.S. Cl. ........ 313/504; 313/505; 313/506; 313/512; 257/40; 257/72; 257/99

(58) Field of Classification Search .......... 313/504–506, 313/512; 257/40, 72, 99
See application file for complete search history.

(56) References Cited

U.S. PATENT DOCUMENTS

| | | | | |
|---|---|---|---|---|
| 3,600,642 A * | 8/1971 | Allison et al. | ................. | 257/343 |
| 7,211,944 B2 * | 5/2007 | Bae et al. | ...................... | 313/503 |
| 7,247,878 B2 * | 7/2007 | Park et al. | ...................... | 257/40 |
| 7,348,598 B2 * | 3/2008 | Oana | ................................ | 257/57 |
| 7,474,061 B2 * | 1/2009 | Oh et al. | ..................... | 315/169.3 |
| 7,586,255 B2 * | 9/2009 | Kim | ................................ | 313/504 |
| 7,772,763 B2 * | 8/2010 | Bae et al. | ....................... | 313/505 |
| 7,821,198 B2 * | 10/2010 | Kim et al. | ...................... | 313/505 |
| 2002/0011783 A1 * | 1/2002 | Hosokawa | ..................... | 313/504 |
| 2002/0195961 A1 * | 12/2002 | Barth et al. | ................. | 315/169.3 |
| 2003/0094607 A1 * | 5/2003 | Guenther et al. | ............... | 257/40 |
| 2003/0173891 A1 * | 9/2003 | Chiba et al. | .................... | 313/500 |
| 2005/0056847 A1 * | 3/2005 | Nakamura et al. | ............... | 257/72 |
| 2005/0247936 A1 * | 11/2005 | Bae et al. | ........................ | 257/59 |
| 2006/0081854 A1 * | 4/2006 | Kim et al. | ....................... | 257/72 |
| 2006/0119259 A1 * | 6/2006 | Bae et al. | ....................... | 313/506 |
| 2006/0263576 A1 * | 11/2006 | Hirose | .......................... | 428/149 |
| 2007/0176863 A1 * | 8/2007 | Oh et al. | .......................... | 345/82 |
| 2007/0212807 A1 * | 9/2007 | Yamada et al. | ................. | 438/99 |

FOREIGN PATENT DOCUMENTS

| | | |
|---|---|---|
| CN | 1499909 A | 5/2004 |
| CN | 1697578 A | 11/2005 |
| CN | 1783488 A | 6/2006 |

* cited by examiner

*Primary Examiner* — Peter Macchiarolo
*Assistant Examiner* — Thomas A Hollweg
(74) *Attorney, Agent, or Firm* — McKenna Long & Aldridge, LLP

(57) ABSTRACT

An organic light emitting diode display device according to the present invention includes a first electrode on a first substrate including a first region and a second region, the second region substantially surrounding the first region; a pixel separating pattern on the first electrode in the second region; an organic light emitting pattern at least in the first region; a second electrode on the organic light emitting pattern; a contact electrode on the pixel separating pattern, the contact electrode being electrically connected to the second electrode; and a thin film transistor on the second substrate facing the first substrate, the thin film transistor being electrically connected to the contact electrode.

8 Claims, 9 Drawing Sheets

ORGANIC LIGHT EMITTING DIODE DISPLAY DEVICE AND METHOD OF MANUFACTURING THE SAME

This application claims the benefit of Korean Patent Application No. 10-2006-0126762, filed Dec. 13, 2006, which is hereby incorporated by reference for all purposes as if fully set forth herein.

BACKGROUND OF THE INVENTION

1. Field of the Invention

The present invention relates to an organic light emitting diode display device, and more particularly, to a dual panel-type organic light emitting diode display device and a method of manufacturing the same.

2. Discussion of the Related Art

Organic light emitting diode (OLED) display devices are self-luminous and thus do not need a backlight unit as in liquid crystal display (LCD) devices, so that they can be manufactured to have a slim profile and lightweight. Also, because the OLED display devices can be manufactured through a simple process, they have price competitiveness. Also, because the OLED display devices have characteristics of low voltage driving, high emission efficiency, and a wide viewing angle, they rapidly emerge as next generation display devices.

An OLED display device includes an array of organic light emitting diodes for generating light and an array of switching devices. Thin film transistors (TFTs) are generally used to individually drive an array of organic light emitting diodes and provide uniform brightness even when a small current is applied. Therefore, the OLED display device has various advantages such as low power consumption, high definition, large size, and improved lifetime.

Because both arrays of the organic light emitting diodes and the switching devices are formed on the same substrate, the process time increases and the process yield decreases. Therefore, dual panel-type OLED display devices have been suggested in which the organic light emitting diodes and the switching devices are formed on the different substrates and they are electrically connected to each other when the two substrates are attached together. Therefore, the production efficiency of the OLED display devices has been improved. However, the electrical contacts between the organic light emitting diodes and the switching devices are unstable and the aperture ratio of the dual panel-type OLED display devices is low.

SUMMARY OF THE INVENTION

Accordingly, the present invention is directed to an organic light emitting diode display device and a manufacturing method thereof that substantially obviate one or more problems due to limitations and disadvantages of the related art.

An advantage of the present invention is to provide an organic light emitting diode display device that can stabilize the electrical contacts between the organic light emitting diodes and the thin film transistors formed on different substrates, and a manufacturing method thereof.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, an organic light emitting diode display device includes a first electrode on a first substrate including a first region and a second region, the second region substantially surrounding the first region; a pixel separating pattern on the first electrode in the second region; an organic light emitting pattern at least in the first region; a second electrode on the organic light emitting pattern; a contact electrode on the pixel separating pattern, the contact electrode being electrically connected to the second electrode; and a thin film transistor on the second substrate facing the first substrate, the thin film transistor being electrically connected to the contact electrode.

In another aspect of the present invention, a method of manufacturing an organic light emitting diode display device includes forming a first electrode on a first substrate including a first region and a second region, the second region substantially surrounding the first region; forming a pixel separating pattern on the first electrode in the second region; forming an organic light emitting pattern at least in the first region; forming a second electrode on the organic light emitting pattern and forming a contact electrode on the pixel separating pattern, the contact electrode being electrically connected to the second electrode; providing a second substrate including a thin film transistor; and attaching the first substrate to the second substrate and electrically connecting the contact electrode with the thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Embodiment 1

Figure 1:
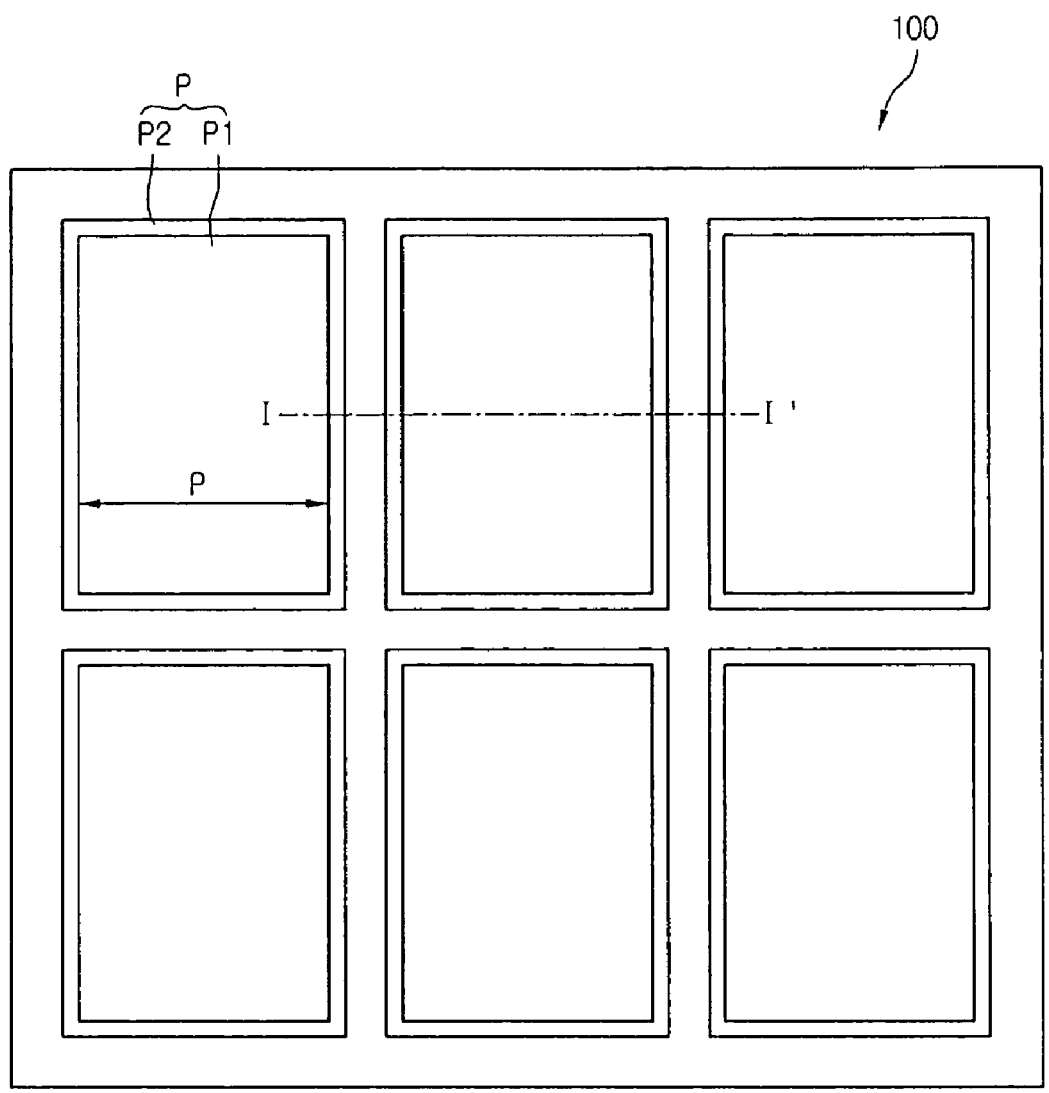
FIG. 1 is a plan view illustrating an organic light emitting diode display device according to an embodiment of the present invention.
Figure 2:
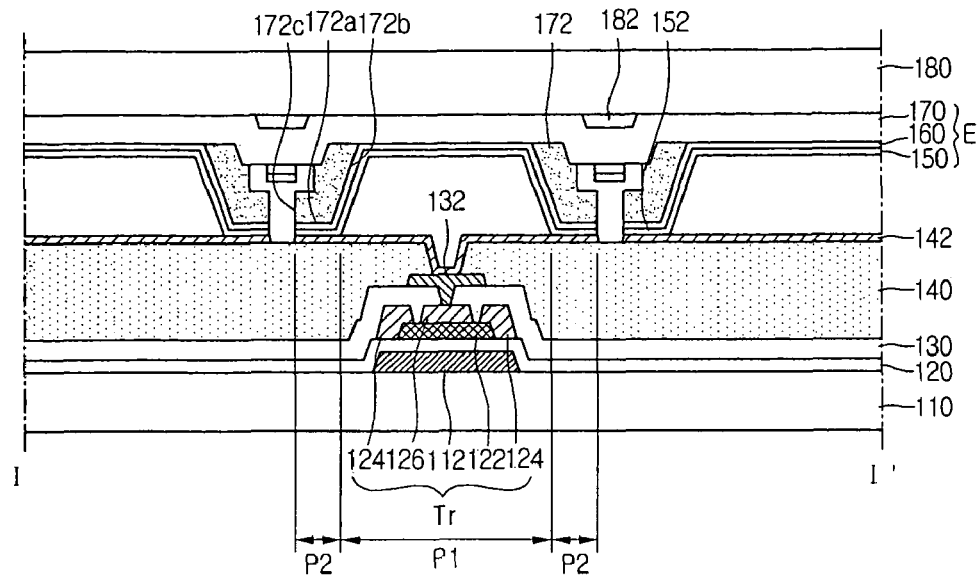
FIG. 2 is a cross-sectional view taken along line I-I' of FIG. 1.

FIGS. 1 and 2 illustrate an organic light emitting diode (OLED) display device according to an embodiment of the present invention. FIG. 1 is a plan view illustrating the OLED display device, and FIG. 2 is a cross-sectional view taken along line I-I' of FIG. 1.

Referring to FIG. 1, the OLED display device 100 includes a plurality of pixels P to display an image. Each pixel P includes a first region P1 where light is generated and a second region P2 disposed along a periphery of the first region P1.

An organic light emitting diode E is formed in the first region P1 for generating light. Also, a contact electrode 152 is formed in the second region P2 for electrically connecting the organic light emitting diode E with a TFT Tr. The contact electrode 152 has a frame shape disposed along the periphery of the first region P1.

The contact region between the TFT Tr and the organic light emitting diode E is larger than that of the related art to reduce the contact resistance. In the related art, because the TFT Tr and the organic light emitting diode E have been electrically connected through a point contact using a spacer within the first region P1, the contact resistance between the TFT Tr and the organic light emitting diode E is high. Also, as the contact region between the TFT Tr and the organic light emitting diode E becomes larger, non-contact defects between the TFT Tr and the organic light emitting diode E caused by an misalignment-during the manufacturing process can be reduced or prevented. As a result, the stability and reliability of the OLED display device can be improved.

In addition, because the electrical contact between the TFT Tr and the organic light emitting diode E is provided in the second region P2 where light is not generated, the aperture ratio of the OLED display device 100 can be improved. Light is not generated in the second region P2 due to a pixel separating pattern 172 formed between a first electrode 170 and a second electrode 150.

Referring to FIG. 2, the OLED display device 100 includes a first substrate 180 and a second substrate 110 separated from each other. The first substrate 180 includes the plurality of pixels P, each pixel having the first region P1 where light is generated and the second region P2 where the electrical contact between the TFT Tr and the organic light emitting diode E is provided.

The first electrode 170, which is a common electrode, is formed on the first substrate 180. That is, the first electrodes 170 of respective pixels P are integrally formed. The first electrode 170 is formed of a transparent conductive material through which light can pass. For example, the first electrode 170 may be formed of indium-tin-oxide (ITO) or indium-zinc-oxide (IZO). The OLED display device 100 emits light through the first electrode 170 and the first substrate 180 to display an image.

An auxiliary electrode 182 is also formed between the first substrate 180 and the first electrode 170 to lower the resistance of the first electrode 170. The auxiliary electrode 182 is formed on the first substrate 180 in a non-display area between the pixels P and thus does not influence on the aperture ratio of the OLED display device 100.

The pixel separating pattern 172 is formed on a portion of the first electrode 170 that corresponds to the second region P2, along a periphery of the first region P1. The pixel separating pattern 172 is formed in a reverse taper shape to pattern the second electrode 150 and the contact electrode 152 for each pixel. The pixel separating pattern 172 includes an upper surface 172a, a first wall surface 172b and a second wall surface 172c. The upper surface 172a is in parallel to the first substrate 180 and corresponds to the second region P2 of the first substrate 180. The first wall surface 172b extends from an edge of the upper surface 172a and has a predetermined angle with respect to the first substrate 180. The first wall surface 172b is formed at a boundary between the first region P1 and the second region P2. The second wall surface 172c faces the first wall surface 172b substantially in parallel, and is formed outside the second region P2. The second wall surface 172c has an undercut shape.

The pixel separating pattern 172 maintains a cell gap between the organic light emitting diode E and the TFT Tr, and provides an electrical contact between the organic light emitting diode E and the TFT Tr. Accordingly, it is possible to minimize or prevent particles that may be generated during the manufacturing process including the process for forming the TFT Tr from damaging the organic light emitting diode E.

The pixel separating pattern 172 may be an organic layer, an inorganic layer, or a stacked layer thereof. For example, the organic layer may be formed of acryl-based resin, urethane-based resin, benzo-cyclo-butene (BCB), and polyimide (PI). Also, the inorganic layer may be formed of silicon oxide or silicon nitride. When the pixel separating pattern 172 is formed of an inorganic material, deterioration of an organic light emitting layer 160 may be reduced or prevented. This is because the organic materials may generate a harmful outgas that degrades the organic light emitting layer 160.

The organic light emitting pattern 160 is formed on a portion of the first electrode 170 that corresponds to the first region P1. In this embodiment, the organic light emitting pattern 160 extends further to the second region P2. However, it should be appreciated that the size and location of the region in which the organic light emitting pattern 160 is formed may change depending on the manufacturing process of the organic light emitting pattern 160.

The organic light emitting pattern 160 generates light when first charges and second charges provided from the first electrode 170 and the second electrode 150, respectively, recombine. The OLED display device 100 emits the light to the first electrode 170 and the first substrate 180 to display an image. In addition, a light efficiency complementing layer (not shown) may be further provided on the upper surface or lower surface of the organic light emitting pattern 160 to enhance the emission efficiency of the OLED display device 100. The light efficiency complementing layer controls an energy level at the boundary between the first electrode 170, the organic light emitting pattern 160, and the second electrode 150, to efficiently provide the first charges and second charges to the organic light emitting pattern 160. The light efficiency complementing layer may be a first charge injection layer, a first charge transport layer, a first charge blocking layer, a second charge transport layer, a second charge injection layer, or the like.

The second electrode 150 is formed on the organic light emitting pattern 160 in the first region P1. The contact electrode 152 extending from the edge of the second electrode 150 is formed on the upper surface 172a of the pixel separating pattern 172. Therefore, the contact electrode 152 has a frame shape exposing the first region P1. The contact electrode 152 electrically connects the second electrode 150 with the TFT Tr. The contact electrode 152 can be integrally formed with the second electrode 150 because the contact electrode 152 and the second electrode 150 may be patterned together for each pixel P by the pixel separating pattern 172.

Therefore, the pixel separating pattern 172 includes the contact electrode 152 formed on the upper surface 172a to maintain a cell gap between the organic light emitting diode E and the TFT Tr and to provide an electrical contact between the organic light emitting diode E with the TFT Tr. That is, the organic light emitting diode E in the first region P1 has a predetermined gap with respect to a second substrate 110, and the contact electrode 152 in the second region P2 contacts a contact member of the TFT Tr of the second substrate 110 due to the pixel separating pattern 172.

Because the pixel separating pattern 172 protrudes toward the second substrate 110, the cell gap between the organic light emitting diode E and the TFT Tr may be maintained. Accordingly, the pixel separating pattern 172 separates the organic light emitting diode E from the second substrate 110 and thus minimizes or prevents contaminants of the second substrate 110 from contaminating and damaging the organic light emitting diode E.

The second substrate 110 has a surface that faces the first substrate 180. At least one TFT Tr electrically connected to the organic light emitting diode E provided in each pixel P is formed on the facing surface.

The TFT Tr includes a gate electrode 112, a gate insulating layer 120, a semiconductor layer 122, and source/drain electrodes 124 and 126. Although not shown in the drawings, a plurality of lines applying signals to the TFT Tr are formed on the facing surface of the second substrate 110. A gate line applying a gate signal to the gate electrode 112 and a data line applying a data signal to the source electrode 126 are, for example, formed on the facing surface of the second substrate 110.

A passivation layer 130 covering the TFT Tr is formed on the gate insulating layer 120 to protect the TFT Tr. The passivation layer 130 may be formed of an inorganic material or organic material. For example, the passivation layer 130 may be formed of silicon oxide or silicon nitride.

When the passivation layer 130 is formed of an inorganic material, the surface of the passivation layer 130 has a surface undulation with different heights due to the underlying structures of the TFT Tr and the signal lines. However, such height differences have an influence on the electrical contact between the contact electrode 152 and a first contact member 142. That is, because of the different heights of the first contact member 142, a contact area between the contact electrode 152 and the first contact member 142 decreases, or the contact electrode 152 and the first contact member 142 may not contact each other. Accordingly, an overcoat layer 140 is formed on the passivation layer 130 to reduce the height difference of the passivation layer 130 and improve a planarization degree of the passivation layer 130. The overcoat layer 140 may be formed of an organic material that can improve a planarization degree of a surface. For example, the overcoat layer 140 may be formed of an acryl-based resin, urethane-based resin, benzo-cyclo-butene (BCB), and polyimide (PI).

The first contact member 142, which is electrically connected with the drain electrode 126 of the TFT Tr and contacts the contact electrode 152, is formed on the overcoat layer 140. Therefore, the TFT Tr and the organic light emitting diode E are electrically connected with each other. The first contact member 142 is formed on a portion of the overcoat layer 140 that corresponds to the second region P2 to contact the contact electrode 152. The first contact member 142 may be formed on an entire surface to prevent a non-contact between the contact electrode 152 and the first contact member 142 caused by an misalignment during the manufacturing process of the OLED display device.

A contact hole exposing the drain electrode 126 is formed in the passivation layer 130 and the overcoat layer 140 to electrically connect the first contact member 142 with the drain electrode 126. During the formation of the contact hole, the drain electrode 126 may be exposed to an etching solution and damaged. Thus, the OLED display device 100 may further include a second contact member 132 covering the drain electrode 126 of the TFT Tr. The second contact member 132 prevents the drain electrode 126 from being damaged by an etching solution. Accordingly, the TFT Tr and the organic light emitting diode E are electrically connected with each other by the contact electrode 152 and the first and second contact members 142 and 132.

In the first embodiment, the TFT Tr and the organic light emitting diode E formed on different substrates contact each other in the second region P2. As a result, the aperture ratio of the OLED device may be improved and the contact resistance of the OLED device may be reduced. Accordingly, the reliability of the OLED display device can be secured.

Embodiment 2

Figure 3:
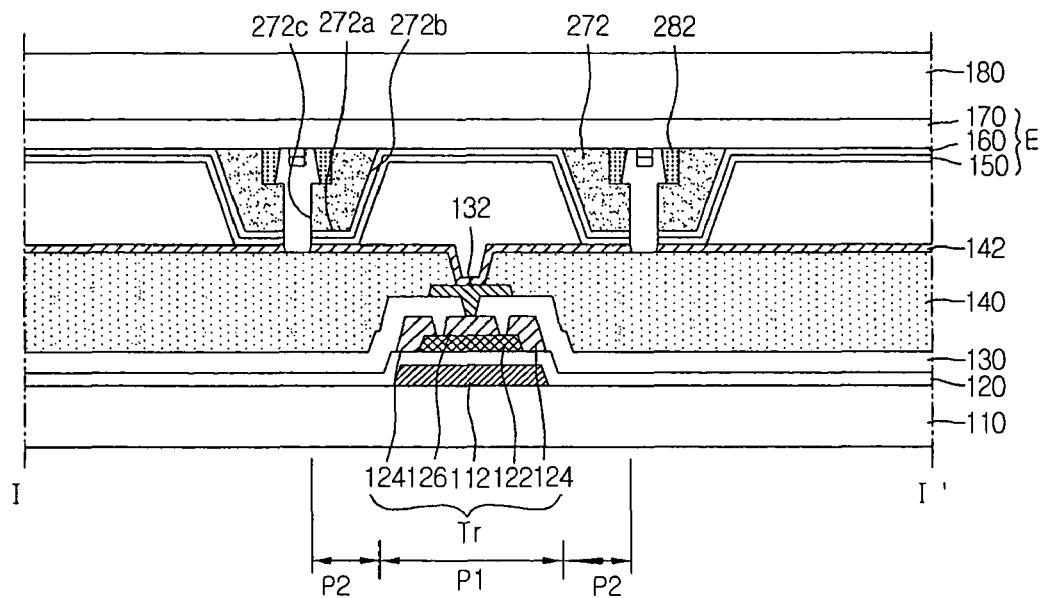
FIG. 3 is a cross-sectional view illustrating an organic light emitting diode display device according to another embodiment of the present invention.

FIG. 3 is a cross-sectional view of an organic light emitting diode (OLED) display device according to another embodiment of the present invention. The OLED display device of this embodiment has the same construction as that of the OLED display device of the first embodiment described above except the shape of the pixel separating pattern. Therefore, descriptions of the same parts are omitted and the same name and reference numerals are used for the same parts.

Referring to FIG. 3, the OLED display device 100 includes a pixel P having a first region P1 generating light and a second region P2 disposed along a periphery of the first region P1.

The OLED display device 100 includes a first substrate 180 and a second substrate 110 facing each other. An organic light emitting diode E is formed on the first substrate 180, and a TFT Tr is formed on the second substrate 110. The organic light emitting diode E and the TFT Tr are electrically connected with each other by a contact electrode 152 corresponding to the second region P2.

The contact electrode 152 and a second electrode 150 of the organic light emitting diode E are integrally formed and patterned for each pixel P by a pixel separating pattern 270. The pixel separating pattern 270 includes an upper surface 272a, a first wall surface 272b, and a second wall surface 272c. The first wall surface 272b extends from the edge of the upper surface 272a and has a predetermined angle with respect to the first substrate 180. The first wall surface 272b is formed at the boundary between the first region P1 and the second region P2. The second wall surface 272c faces the first wall surface 272b approximately in parallel, and is formed outside the second region P2. At this point, the second wall surface 272c has an undercut shape.

An auxiliary electrode 282 is formed inside the undercut to contact a first electrode 170. The undercut is formed by taking advantage of different etching selectivities of the auxiliary electrode 282 and the pixel separating pattern 270. Accordingly, a separate layer for forming the undercut is not required and thus the number of manufacturing processes can be reduced. Inside the undercut is not filled with the auxiliary electrode 282 to pattern the contact electrode 152 and the second electrode 150 for each pixel. The auxiliary electrode 282 overlaps a contact electrode 152 with the pixel separating pattern 270 being interposed. Also, because the pixel separating pattern 270 defining the pixel has a frame shape, the auxiliary electrode 282 has a frame shape.

In the second embodiment, the undercut shape of the pixel separating pattern 270 is formed using the auxiliary electrode 282. As a result, the number of manufacturing processes of the OLED display device can be reduced.

Embodiment 3

Figure 4:
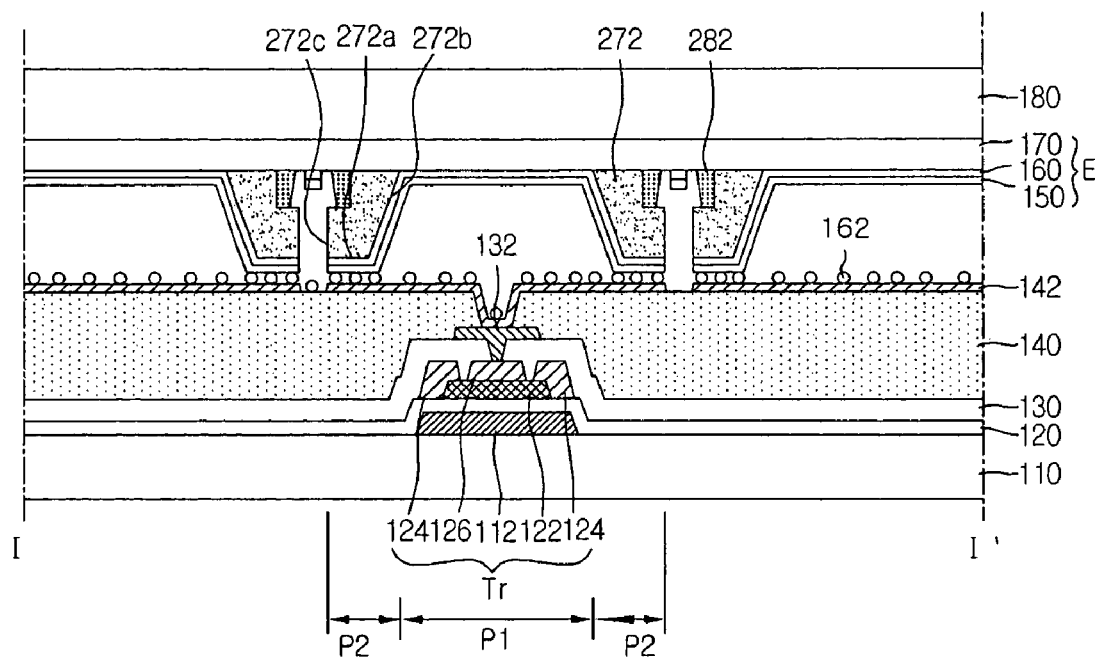
FIG. 4 is a cross-sectional view illustrating an organic light emitting diode display device according to still another embodiment of the present invention.

FIG. 4 is a cross-sectional view of an organic light emitting diode (OLED) display device according to another embodiment of the present invention. The OLED display device of this embodiment has the same construction as that of the OLED display device of the second embodiment described above except a conductive elastic member. Therefore, descriptions of the same parts are omitted and the same name and reference numerals are used for the same parts.

Referring to FIG. 4, the OLED display device 100 includes a first substrate 180 and a second substrate 110 facing each other. An organic light emitting diode E is formed on the first substrate 180, and a TFT Tr is formed on the second substrate 110. As a contact electrode 152 and a first contact member 142 formed to correspond to the second region P2 contact each other, the organic light emitting diode E and the TFT Tr are electrically connected with each other.

The OLED display device 100 includes a conductive elastic member 162 interposed between the contact electrode 152 and the first contact member 142. The conductive elastic member 162 is formed in at least the second region P2 of the second substrate 110. The conductive elastic member 162 improves the stability of the contact between the contact electrode 152 and the first contact member 142 when the first substrate 180 and the second substrate 110 are attached to each other. Because the conductive elastic member 162 has an elasticity, it can minimize or prevent devices interposed between the first and second substrates 180 and 110 from being damaged even when a pressure is applied during the attaching process of the first and second substrates 180 and 110. Without the conductive elastic member 162, a lower pressure may be applied when attaching the first and second substrates 180 and 110 because of the concerns over damages of the devices between the first and second substrates 180 and 110, which may generate a contact defect between the organic light emitting diode E and the TFT Tr. Accordingly, the conductive elastic member 162 may minimize or prevent such a contact defect of the OLED display device.

The conductive elastic member 162 may be a conductive ball or conductive film. The conductive ball may include an elastic body and a conductive layer covering the elastic body. Also, the conductive film may include a film-shaped elastic body and conductive materials dispersed inside the elastic body. The elastic body can be formed of silicon or synthetic resin.

In the third embodiment, the conductive elastic member 162 is additionally formed between the contact electrode 152 and the first contact member 142. As a result, the stability of the contact between the organic light emitting diode E and the TFT Tr can be further improved.

Embodiment 4

FIGS. 5A to 5J are cross-sectional views illustrating a method for manufacturing an organic light emitting diode (OLED) display device according to an embodiment of the present invention.

Figure 5A:
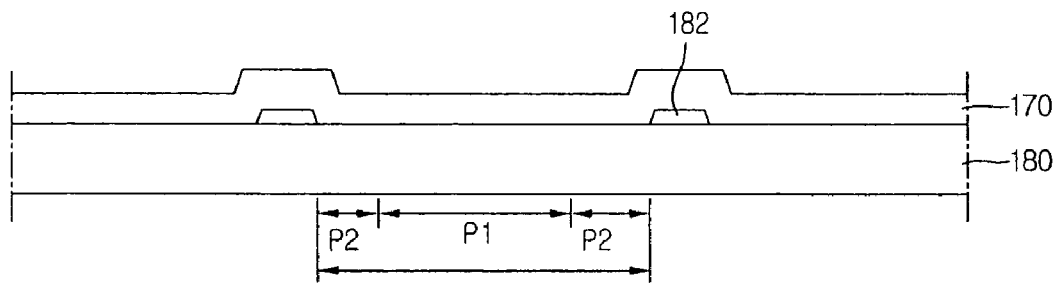
FIGS. 5A to 5J are cross-sectional views explaining a method for manufacturing an organic light emitting diode display device according to an embodiment of the present invention.

Referring to FIG. 5A, a first substrate 180 defining a plurality of pixels P is provided to manufacture an OLED display device. Respective pixels P are arranged with a constant interval. The pixel P is divided into a first region P1 and a second region P2 along a periphery of the first region P1.

The first substrate 180 may be a transparent substrate through which light can pass. For example, the first substrate 180 can be a glass substrate, a plastic substrate, or a transparent film.

A conductive material of a lower resistivity than that of a first electrode 170 is deposited and patterned on the first substrate 180 to form an auxiliary electrode 182. For example, the auxiliary electrode 182 includes Al, AlNd, Mo, Cr, or the like. The auxiliary electrode 182 serves to reduce the resistance of the first electrode 170. Also, the auxiliary electrode 182 is formed at the boundaries of the pixels P to prevent light from leaking.

The first electrode 170 is then formed on the first substrate 180 including the auxiliary electrode 182. The first electrode 170 may be formed of a transparent conductive material by a sputtering or vacuum deposition. For example, the first electrode 170 can be formed of ITO or IZO.

Figure 5B:
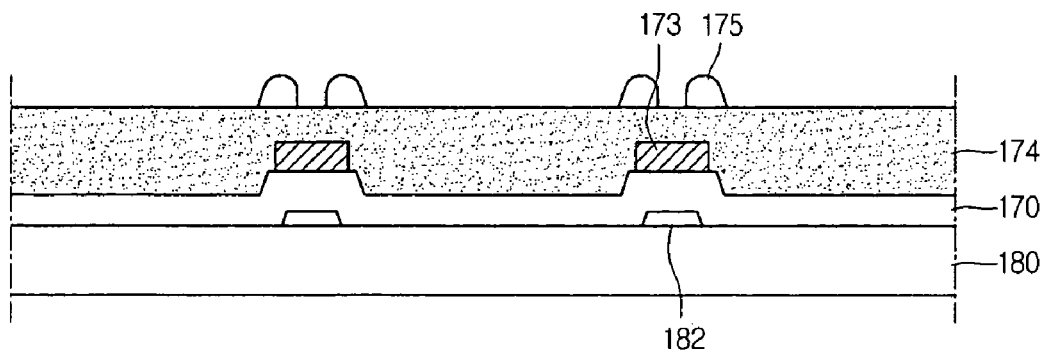

Referring to FIG. 5B, after the first electrode 170 is formed, sacrificial patterns 173 are formed on the first electrode 170 to expose the pixels P. That is, the sacrificial patterns 173 are formed at the boundaries between the pixels P. The sacrificial patterns 173 are formed on a portion of the first electrodes 170 that overlaps the auxiliary electrodes 182. The sacrificial patterns 173 form an undercut shape of pixel separating patterns 172. The sacrificial patterns 173 may be completely removed or a portion of the sacrificial pattern 173 may be left during the subsequent processes.

After the sacrificial patterns 173 are formed, an insulating layer 174 is formed on the first substrate 180 including the sacrificial patterns 173. The insulating layer 174 is formed of a material having an etching selectivity different from that of the sacrificial patterns 173. In this embodiment, the insulating layer 174 is formed of a material having an etching selectivity smaller than that of the sacrificial patterns 173 to form the pixel separating patterns 172 having an the undercut-shape. For example, the sacrificial patterns 173 can be formed of silicon nitride or silicon oxide. The insulating layer 174 can be formed of an acryl-based resin, urethane-based resin, benzo-cyclo-butene (BCB), polyimide (PI), silicon nitride, silicon oxide, or the like.

After the insulating layer 174 is formed, photoresist patterns 175 are formed on the insulating layer 174. The photoresist patterns 175 divide the pixels P and has a frame shape around the edge of the pixel P.

Figure 5C:
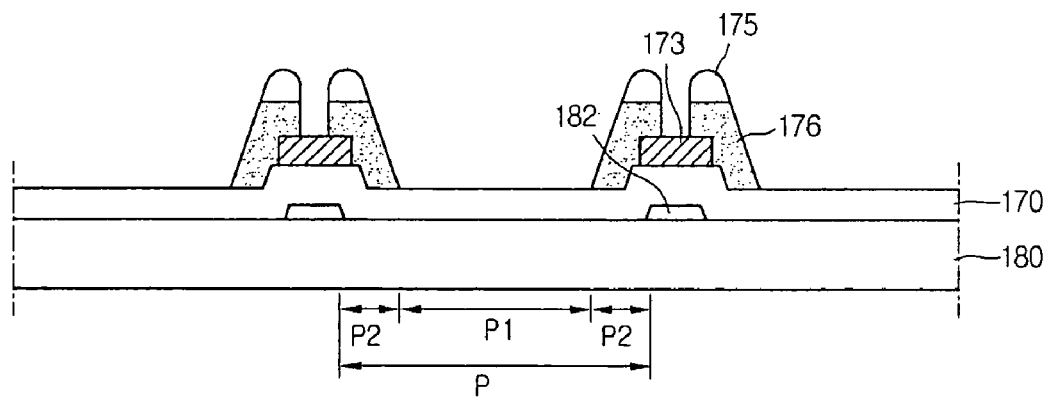

Referring to FIG. 5C, after the photoresist patterns 175 are formed, the insulating layer 174 is etched using the photoresist pattern 175 as a mask to form insulating patterns 176 in the second region P2. The insulating layer can be etched by a dry or wet etching method.

Figure 5D:
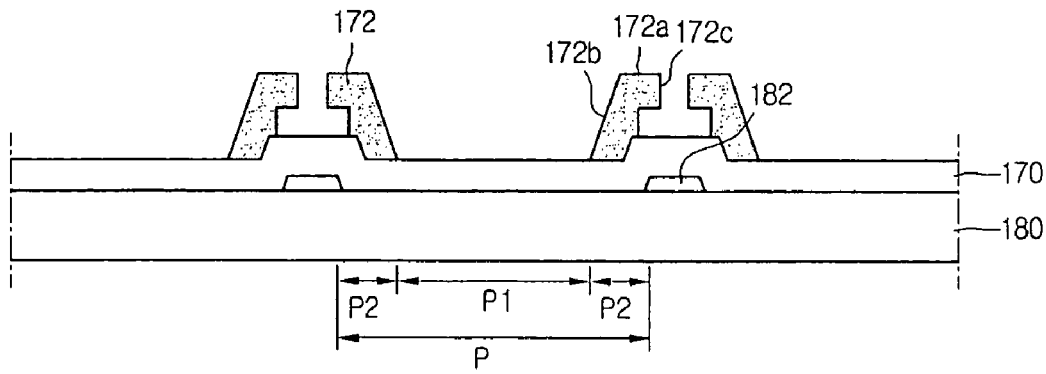

Referring to FIG. 5D, after the insulating patterns 176 are formed, the sacrificial patterns 173 are etched along with the insulating patterns 176 to form the pixel separating patterns 172. Because the insulating patterns 176 and the sacrificial patterns 173 have different etching selectivities, a wall surface of the pixel separating patterns 172 has an undercut shape. In this embodiment, the insulating patterns 176 have a smaller etching selectivity than that of the sacrificial patterns 173. The pixel separating patterns 172 include an upper surface 172a, a first wall surface 172b, and a second wall surface 172c.

The first wall surface 172b extends from an edge of the upper surface 172a, and has a predetermined angle with respect to the first substrate 180. The first wall surface 172b is formed at the boundary between the first region P1 and the second region P2. The second wall surface 172c faces the first wall surface 172b approximately in parallel, and is formed outside the second region P2. The second wall surface 172c has an undercut shape.

Figure 5E:
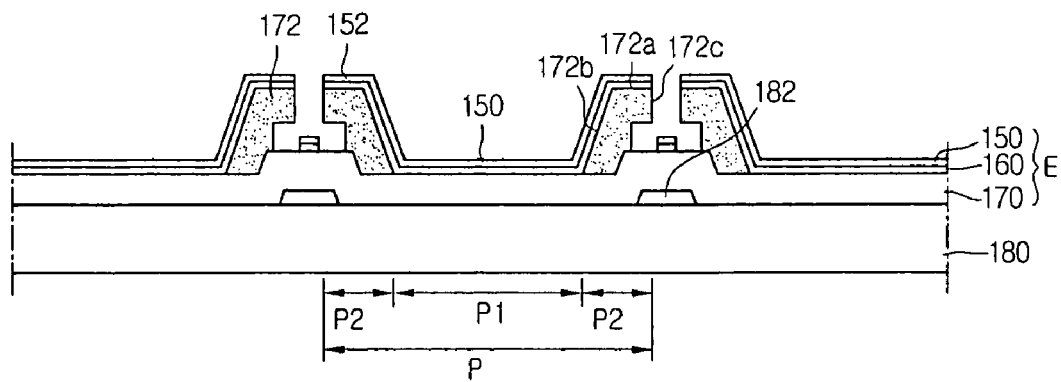

Referring to FIG. 5E, after the pixel separating patterns 172 are formed, an organic light emitting patterns 160 are formed on the first electrode 170. The organic light emitting patterns 160 my be formed of a low molecular material or polymer. When the organic light emitting patterns 160 are formed of a low molecular material, the organic light emitting patterns 160 may be formed by a vacuum deposition method. The organic light emitting patterns 160 are formed on a portion of the first electrode 170 and the upper surfaces 172a of the pixel separating patterns 172 that correspond to the first regions P1.

After the organic light emitting patterns 160 are formed, a second electrode 150 and a contact electrode 152 are formed and patterned for each pixel P by the pixel separating patterns 172.

The second electrode 150 and the contact electrode 152 may be integrally formed. That is, a conductive material is deposited on the substrate 180 including the pixel separating patterns 172 by a vacuum deposition method. During the deposition of the conductive material, the second electrode 150 and the contact electrode 152 are automatically patterned by the pixel separating patterns 172 for each pixel P. The contact electrode 152 is formed on the upper surface 172a of the pixel separating pattern 172, and the second electrode 150 is formed on a portion of the organic light emitting pattern 160 that corresponds to the first region P1. Accordingly, the first electrode 170, the organic light emitting pattern 160 and the second electrode 150 are sequentially formed in the first region P1 that generates light. Also, the first electrode 170, the pixel separating pattern 172, the organic light emitting pattern 160 and the second electrode 150 are sequentially formed in the second region P2 that does not generate light.

Figure 5F:
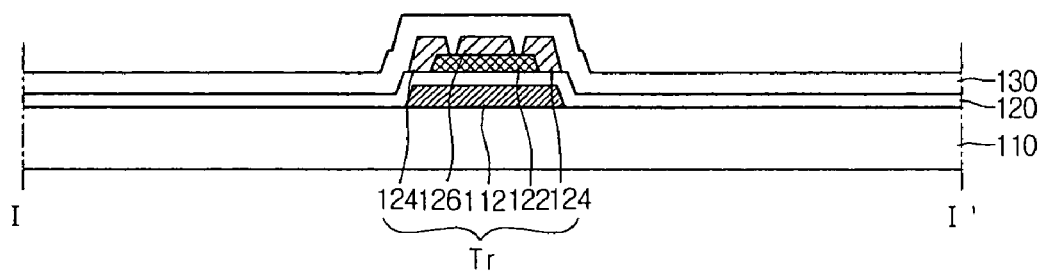

Referring to FIG. 5F, a second substrate 110 where TFTs Tr are formed is provided. A passivation layer 130 is formed on the second substrate 110 to cover the TFTs Tr. The passivation layer 130 may be formed of silicon oxide or silicon nitride by a chemical vapor deposition (CVD) method.

Figure 5G:
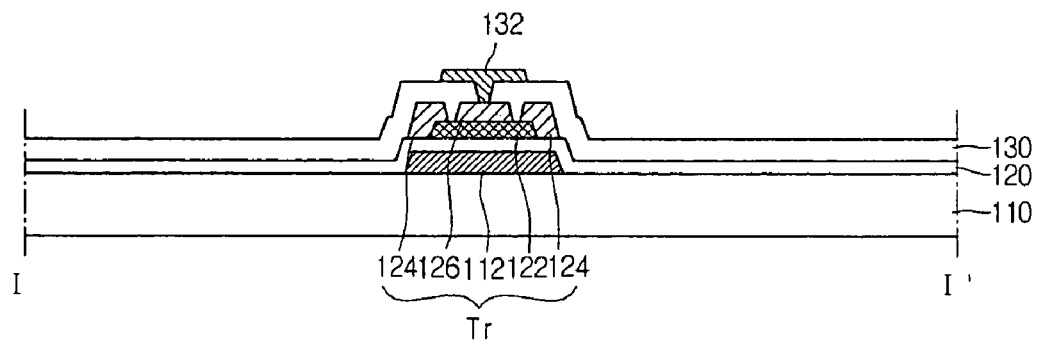

Referring to FIG. 5G, a contact hole exposing a drain electrode 126 of the TFT Tr is formed in the passivation layer 130. A second contact member 132 covering the drain electrode 126 exposed through the contact hole is formed. The second contact member 432 prevents the drain electrode 126 from being damaged during a subsequent process.

Figure 5H:
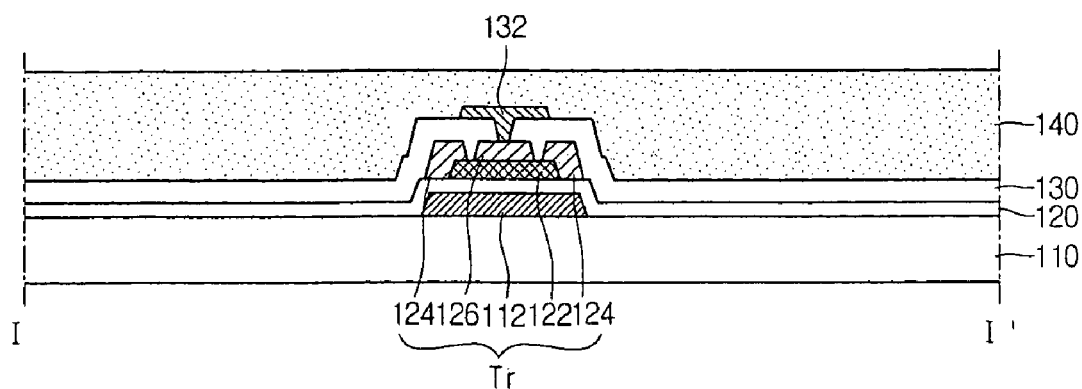

Referring to FIG. 5H, after the second contact member 132 is formed, an overcoat layer 140 covering the second contact member 132 is formed on the passivation layer 130. The overcoat layer 140 improves a planarization degree of the passivation layer 130. The overcoat layer 140 may be formed of an organic material that is advantageous in planarization. The overcoat layer 140 can be formed by a dip coating, spray coating, or spin coating method.

Figure 5I:
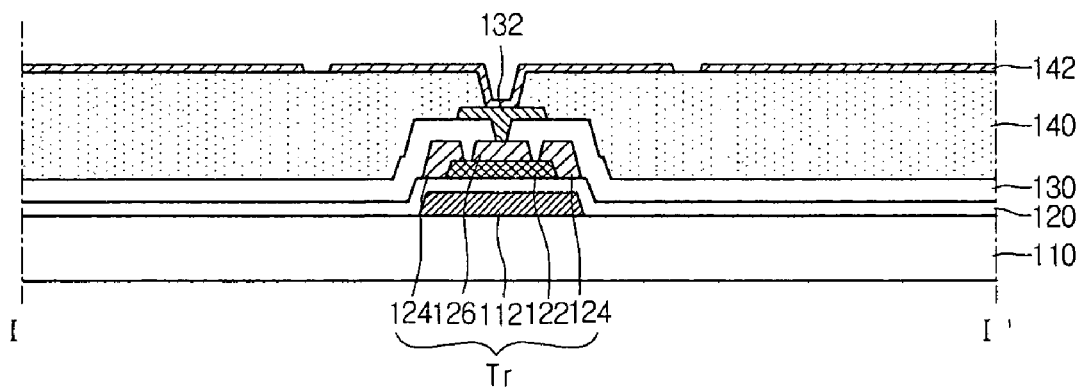

Referring to FIG. 5I, after the overcoat layer 140 is formed, a via hole exposing the second contact member 132 is formed in the overcoat layer 140. A first contact member 142 contacting the second contact member 132 exposed through the via hole is then formed. The first contact member 142 has a flat surface because of the overcoat layer 140. The first contact members 142 are formed on portions of the second substrate 110 that correspond to the first and second regions P1 and P2.

Figure 5J:
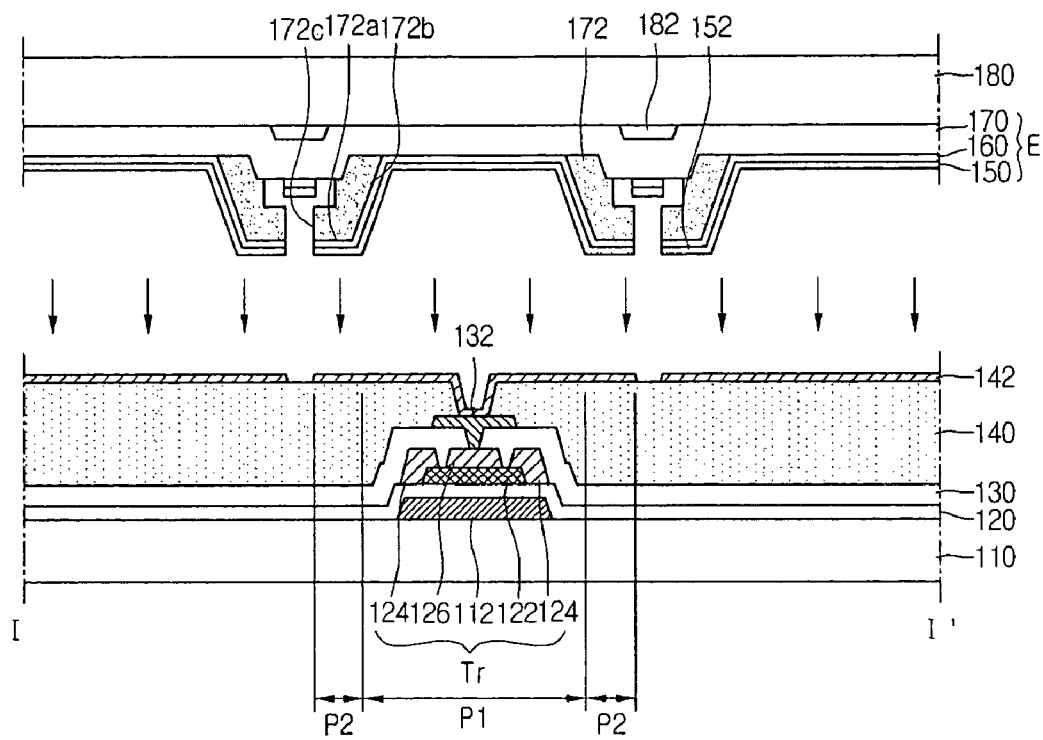

Referring to FIG. 5J, the first substrate 180 on which the organic light emitting diode E is formed, and the second substrate 110 on which the TFT Tr is formed are attached to each other. The contact electrode 152 and the first contact member 142 contact each other, thereby electrically connecting the organic light emitting diode E with the TFT Tr.

Before the first and second substrates 180 and 110 are attached to each other, a conductive elastic member may be formed on one of the first and second substrates 180 and 110 to improve the stability of the contact. The conductive elastic member can be a conductive ball or conductive film. Also, it should be appreciated that a forming order of the organic light emitting diode E and the TFT Tr is not limited.

In this embodiment, because the contact electrode 152 is formed in the second region P2 where light is not generated, the aperture ratio of the completed OLED display device may be improved. Also, because the contact area of the contact electrode 152 and the first contact member 142 is larger, the contact resistance of the organic light emitting diode E and the TFT Tr may be decreased and a non-contact defect may be reduced even when an misalignment is generated during the attaching process of the first substrate 180 and the second substrate 100.

Embodiment 5

FIGS. 6A to 6F are cross-sectional views illustrating a method for manufacturing an organic light emitting diode (OLED) display device according to another embodiment of the present invention. The manufacturing method in this embodiment is the same as the manufacturing method described above except the formation of pixel separating patterns. Therefore, descriptions of the same process are omitted and the same name and reference numerals are used for the same parts.

Figure 6A:
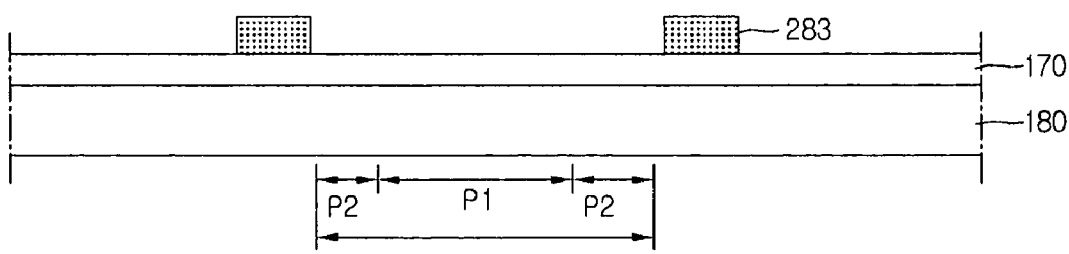
FIGS. 6A to 6F are cross-sectional views explaining a method for manufacturing an organic light emitting diode display device according to another embodiment of the present invention.

Referring to FIG. 6A, a first substrate 180 is provided to manufacture an OLED display device. A first electrode 170 is formed on the first substrate 180.

Conductive patterns 283 are then formed on the first electrode 170. The conductive patterns 283 define pixels P. The conductive patterns 283 are formed of a conductive material having a lower resistivity than that of the first electrode 170. For example, the conductive patterns 283 may be formed of Mo, Cu, Cr, AlNd, MoW, or the like. The conductive patterns may be formed by a vacuum deposition or sputtering method.

Figure 6B:
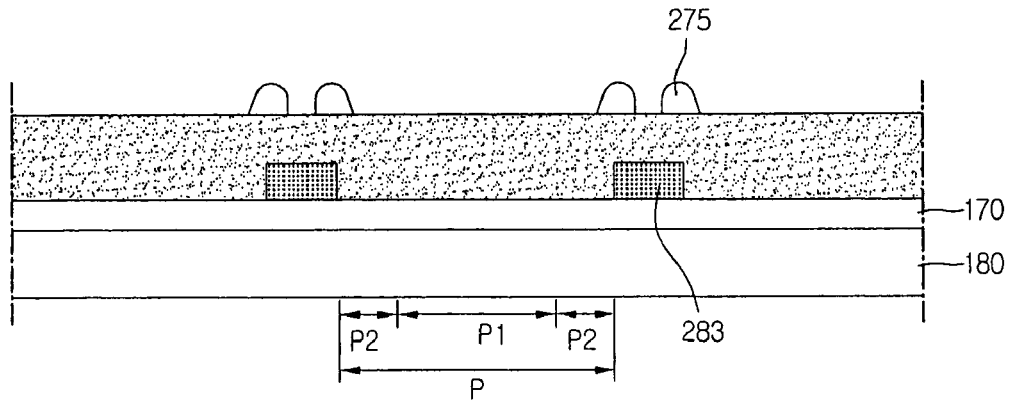

Referring to FIG. 6B, after the conductive patterns 283 are formed, an insulating layer 274 is formed on the first substrate 180 including the conductive patterns 283. The insulating layer 274 may be an inorganic layer formed by a CVD or sputtering method. Photoresist patterns 275 defining pixels P are then formed on the insulating layer 274.

Figure 6C:
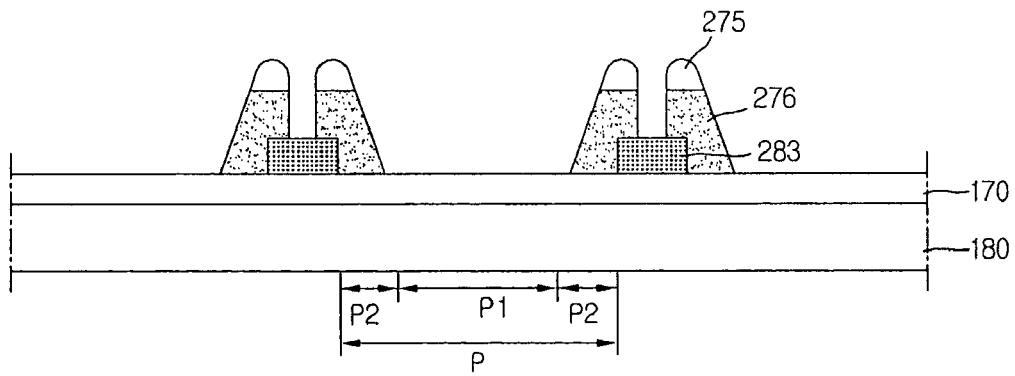

Referring to FIG. 6C, after the photoresist patterns 275 are formed, the insulating layer 274 is etched using the photoresist patterns 275 as a mask to form insulating patterns 276 in a second region P2 of the pixel P. The first electrode 170 is exposed in a first region P1.

Figure 6D:
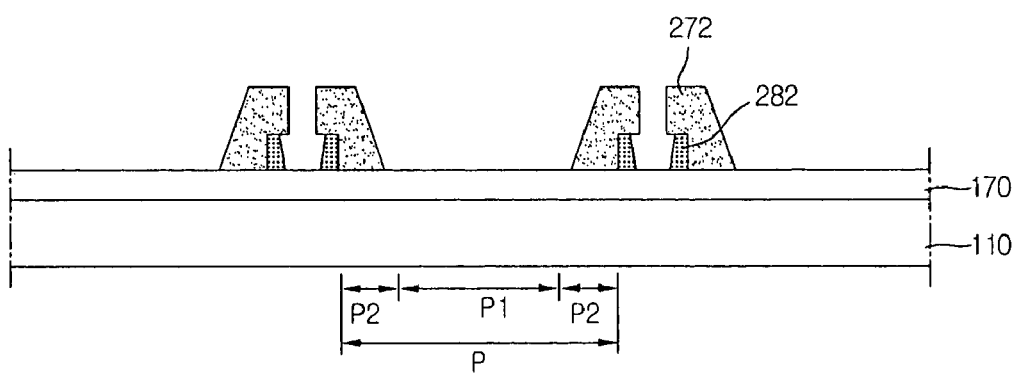

Referring to FIG. 6D, after the insulating patterns 276 are formed, the conductive patterns 283 are etched along with the insulating patterns 276 and the photoresist patterns 275 to form auxiliary electrodes 282 and pixel separating patterns 272. In this embodiment, the conductive patterns 283 are etched by a wet etching method so that the pixel separating patterns 272 have an undercut shape.

Figure 6E:
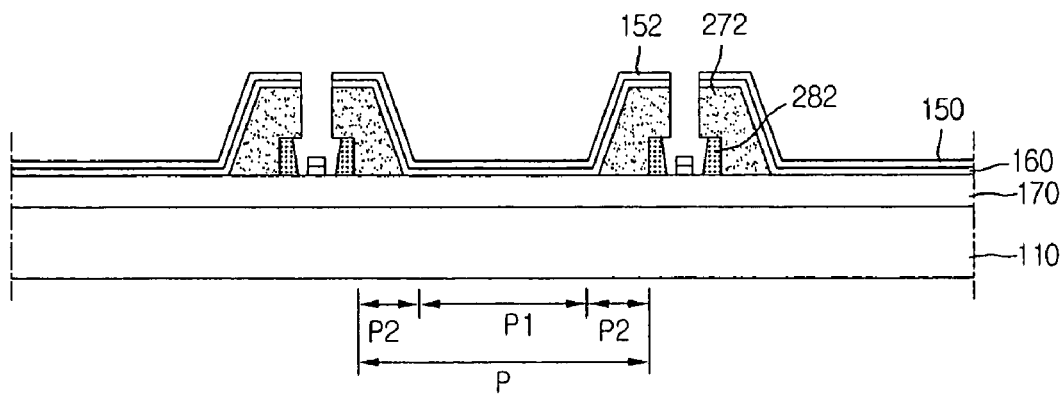

Referring to FIG. 6E, after the pixel separating patterns 272 are formed, an organic light emitting pattern 160, a second electrode 150, and a contact electrode 152 are formed on the first electrode 170.

The second electrode 150 and the contact electrode 152 may be integrally formed. The second electrode 150 and the contact electrode 152 are automatically patterned by the pixel separating patterns 272 for each pixel P. Accordingly, an organic light emitting diode E and the contact electrode 152 are formed on the first substrate 180.

Figure 6F:
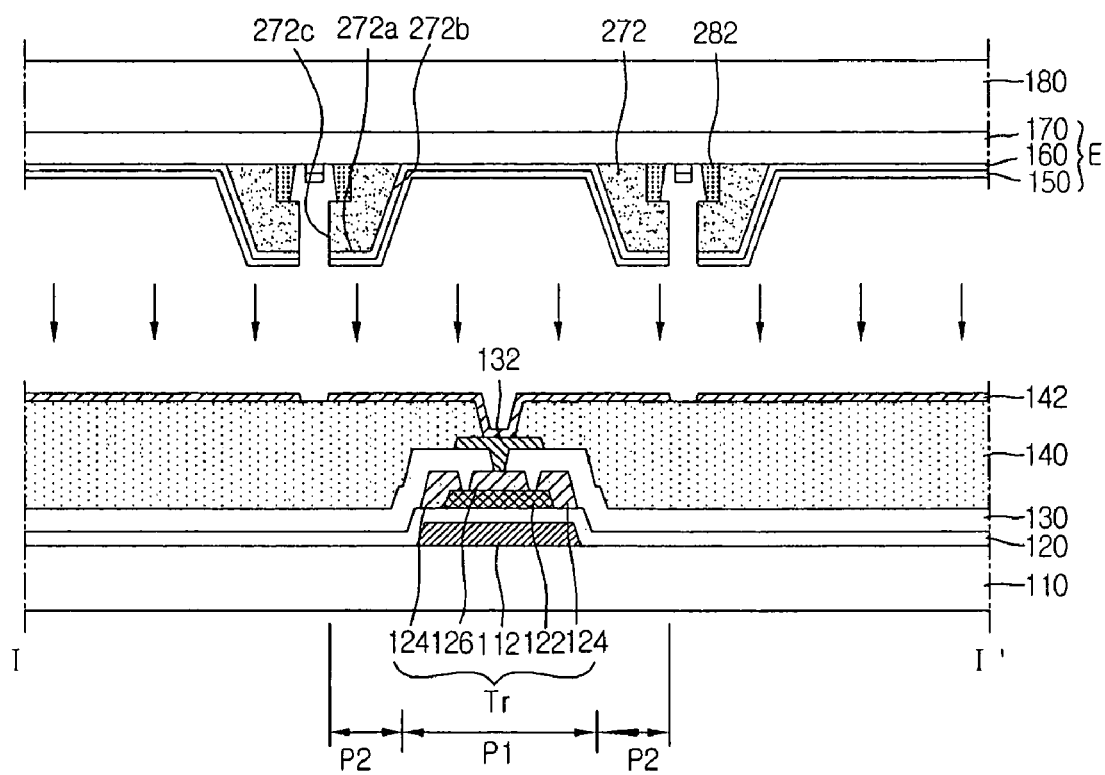

Referring to FIG. 6F, after the organic light emitting diode E and the contact electrode 152 are formed, a second substrate 110 on which a TFT Tr and a first contact member 142 are formed is provided. The first and second substrates 180 and 110 are then attached to each other, with the contact electrode 152 and the first contact member 142 contacting each other, thereby completing the fabrication of the OLED display device.

In this embodiment, a separate sacrificial layer for forming the pixel separating patterns is not formed to reduce the number of manufacturing processes. Also, the reliability and aperture ratio of the OLED device may be improved.

As described above, in an OLED device according to the present invention, the arrays of organic light emitting diodes and TFTs are formed on different substrates. Accordingly, the process yield may be improved. Also, because the electrical contact between the organic light emitting diode and TFT is formed in a non-emitting portion of the pixel P, the aperture ratio and brightness can be further improved.

In addition, because the electrical contact is formed along a periphery of the pixel P, the contact area between the organic light emitting diode and the TFT can be larger, the reliability of the OLED display device may be improved, and the contact resistance of the organic light emitting diode and the TFT as well as the driving voltage of the OLED display device may be lowered.

Moreover, because the contact electrodes are provided on the upper surfaces of the pixel separating patterns, the organic light emitting diodes and the TFTs may be electrically connected with each other with a cell gap so that damages of the organic light emitting diodes caused by the substrate on which an array of TFTs has been formed may be reduced or prevented.

Also, according to an embodiment of the present invention, because the pixel separating patterns are formed using the auxiliary electrodes, a separate sacrificial layer does not need to be formed, so that the number of processes can be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device comprising:
   a first electrode on a first substrate including a first region and a second region, the second region substantially surrounding the first region;
   a pixel separating pattern on the first electrode in the second region;
   an organic light emitting pattern at least in the first region;
   a second electrode on the organic light emitting pattern;
   a contact electrode on the pixel separating pattern, the contact electrode and the second electrode are formed as a single body;
   a thin film transistor on the second substrate facing the first substrate, the thin film transistor being electrically connected to the contact electrode, wherein the thin film transistor includes a gate electrode, a gate insulating layer, a semiconductor layer and source and drain electrodes;
   a passivation layer on the second substrate, the passivation layer covering the thin film transistor;
   an overcoat layer on the passivation layer;
   a first contact member on the overcoat layer, the first contact member being electrically connected with the thin film transistor and contacting the contact electrode to electrically connect the thin film transistor with the second electrode; and
   a second contact member on the passivation layer, the second contact member being electrically connected to the drain electrode of the thin film transistor and the first contact member in a contact hole formed on the overcoat layer,
   wherein the drain electrode is disposed on a center area of the semiconductor layer overlapped with the gate electrode and the source electrodes are disposed on edge areas of the semiconductor layer across the drain electrode,
   wherein the contact hole is formed on the second contact member corresponding to the drain electrode,
   wherein the second contact member is connected with the first contact member in the contact hole, and
   wherein the contact electrode is directly contacted to the first contact member on the over coat layer.

2. The device according to claim 1, wherein the pixel separating pattern has an undercut shape.

3. The device according to claim 2, further comprising an auxiliary electrode on a portion of the first electrode that corresponds to an undercut region of the pixel separating pattern.

4. The device according to claim 1, further comprising an auxiliary electrode between the first substrate and the first electrode.

5. The device according to claim 1, wherein the second region has a frame shape around an edge of the first region.

6. The device according to claim 1, wherein the pixel separating pattern is formed of one of an organic material, an inorganic material and a stacked layer thereof.

7. The device according to claim 1, wherein the first contact member has a shape corresponding to at least the second region.

8. The device according to claim 1, further comprising a conductive elastic member between the contact electrode and the first contact member.

* * * * *